(12) United States Patent
Mitsui

(10) Patent No.: US 10,834,834 B2
(45) Date of Patent: Nov. 10, 2020

(54) ELECTRICAL CONNECTION BOX

(71) Applicant: Yazaki Corporation, Tokyo (JP)

(72) Inventor: Takahiko Mitsui, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/174,633

(22) Filed: Oct. 30, 2018

(65) Prior Publication Data

US 2019/0132966 A1  May 2, 2019

(30) Foreign Application Priority Data

Nov. 1, 2017 (JP) .................. 2017-211604

(51) Int. Cl.
*H05K 5/00* (2006.01)
*H05K 1/14* (2006.01)
(Continued)

(52) U.S. Cl.
CPC ....... *H05K 5/0069* (2013.01); *B60R 16/0238* (2013.01); *H01R 33/02* (2013.01);
(Continued)

(58) Field of Classification Search
CPC .......... H05K 7/026; H05K 1/144; H05K 2201/10757; H05K 2201/10189; H05K 2201/1059; H05K 3/308; H05K 3/3447; H05K 2201/10303; H05K 2201/10659; H05K 3/202; H05K 3/328; H05K 3/4092; H05K 5/0052; H05K 1/0254; H05K 2201/0397; H05K 2201/09063; H05K 2201/09145; H05K 2201/10272; H05K 5/0008; H05K 5/006; H05K 5/0069; H05K 5/0221; H01R 9/2466; H01R 9/2425; H01R 12/523; H01R 12/585; H01R 13/41; H01R 9/22; H01R 9/226; H01R 12/58; H01R 12/7088; H01R 13/112; H01R 13/447; H01R 13/502; H01R 2201/26;
(Continued)

(56) References Cited

U.S. PATENT DOCUMENTS 7,247,031 B2 * 7/2007 Naito ................... H01R 9/2458
439/75
7,387,516 B2 * 6/2008 Hayakawa ........... H01R 9/2425
439/76.2

(Continued)

FOREIGN PATENT DOCUMENTS

JP    2010-110058 A    5/2010

*Primary Examiner* — Edwin A. Leon
*Assistant Examiner* — Matthew T Dzierzynski
(74) *Attorney, Agent, or Firm* — Sughrue Mion, PLLC

(57) ABSTRACT

An electrical connection box includes: a frame main body; a lid assembled to the frame main body; a plate-shaped member sandwiched between the frame main body and the lid; and a bus bar which has a main body arranged on a surface of the plate-shaped member and a terminal portion bent from the main body toward the lid. The bus bar has a protrusion protruding from a side surface of the terminal portion. The lid has a bus bar holding portion into which the terminal portion is inserted. In the bus bar holding portion, a wall portion opposing the side surface of the terminal portion has a holding groove into which the protrusion is press-fitted.

11 Claims, 15 Drawing Sheets

(51) Int. Cl.
  *H01R 33/88*   (2006.01)
  *H01R 33/02*   (2006.01)
  *B60R 16/023*  (2006.01)
  *H02B 1/044*       (2006.01)
  *H01R 13/11*       (2006.01)
  *H01R 9/22*        (2006.01)
  *H01R 13/41*       (2006.01)

(52) U.S. Cl.
  CPC .............. *H01R 33/88* (2013.01); *H05K 1/144* (2013.01); *H05K 5/006* (2013.01); *B60R 16/0239* (2013.01); *H01R 9/226* (2013.01); *H01R 13/112* (2013.01); *H01R 13/41* (2013.01); *H01R 2201/26* (2013.01); *H02B 1/044* (2013.01); *H05K 5/0008* (2013.01); *H05K 5/0052* (2013.01)

(58) Field of Classification Search
  CPC ........ H01R 31/06; H01R 33/02; H01R 33/88; H01R 43/0256; H01R 9/096; H01R 9/2458

See application file for complete search history.

(56) References Cited

U.S. PATENT DOCUMENTS

| | | | |
|---|---|---|---|
| 7,390,198 B2* | 6/2008 | Oka | H01R 9/2425 |
| | | | 439/76.2 |
| 7,419,386 B2* | 9/2008 | Washihira | B60R 16/0239 |
| | | | 361/775 |
| 7,771,212 B2* | 8/2010 | Miyamoto | H05K 7/026 |
| | | | 439/76.2 |
| 8,257,097 B2* | 9/2012 | Kawaguchi | H05K 7/026 |
| | | | 439/76.2 |
| 9,686,877 B2* | 6/2017 | Tokumasu | H05K 5/0221 |
| 9,941,678 B2* | 4/2018 | Kawamura | B60R 16/0238 |
| 2007/0020968 A1* | 1/2007 | Oka | H01R 9/2466 |
| | | | 439/76.2 |
| 2010/0105222 A1 | 4/2010 | Miyamoto | |

* cited by examiner

ELECTRICAL CONNECTION BOX

CROSS-REFERENCE TO RELATED APPLICATION(S)

The present application claims priority to and incorporates by reference the entire contents of Japanese Patent Application No. 2017-211604 filed in Japan on Nov. 1, 2017.

BACKGROUND OF THE INVENTION

1. Field of the Invention

The present invention relates to an electrical connection box.

2. Description of the Related Art

Conventionally, there is an electrical connection box for accommodating a bus bar. Japanese Patent Application Laid-open No. 2010-110058 discloses a technique of an electrical connection box in which a bus bar is arranged in contact with an inner surface of a case, an attachment piece provided on the bus bar is inserted and fixed into an attachment hole provided in the case, the attachment piece of the bus bar has a rectangular cross-sectional shape, the attachment hole of the case is a circular hole or a rectangular hole, at least a part of an outer circumference of the attachment piece is in contact with an inner circumferential surface of the attachment hole, and the bus bar is positioned and held in the case by regulating movement of the attachment piece.

There is room for improvement in terms of improving the workability of assembling work of the electrical connection box for accommodating the bus bar.

SUMMARY OF THE INVENTION

It is an object of the present invention to provide a the electrical connection box which can improve the workability of assembling work.

An electrical connection box according to one aspect of the present invention includes a frame main body; a lid assembled to the frame main body; a plate-shaped member sandwiched between the frame main body and the lid; and a bus bar that has a main body arranged on a surface of the plate-shaped member and a terminal portion bent from the main body toward the lid, wherein the bus bar has a protrusion protruding from a side surface of the terminal portion, the lid has a bus bar holding portion into which the terminal portion is inserted, and in the bus bar holding portion, a wall portion opposing the side surface of the terminal portion has a holding groove into which the protrusion is press-fitted.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an electrical connection box according to an embodiment of the present invention will be described in detail with reference to the drawings. Incidentally, the invention is not limited by the embodiment. In addition, constituent elements in the following embodiments include constituent elements which can be easily assumed by those skilled in the art or substantially identical constituent elements.

Embodiment

Figure 1:
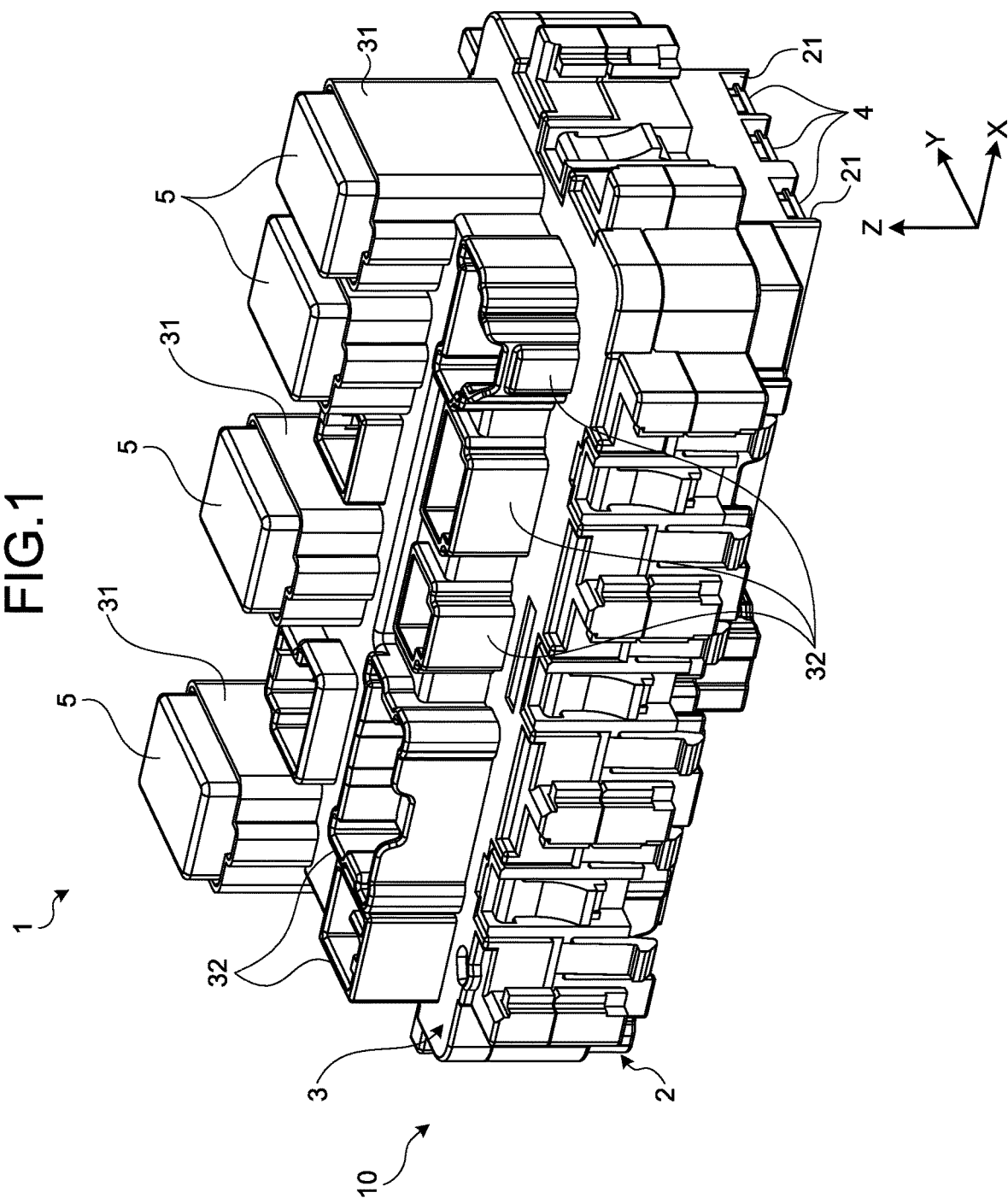
FIG. 1 is a perspective view illustrating an electrical connection box according to an embodiment.
Figure 2:
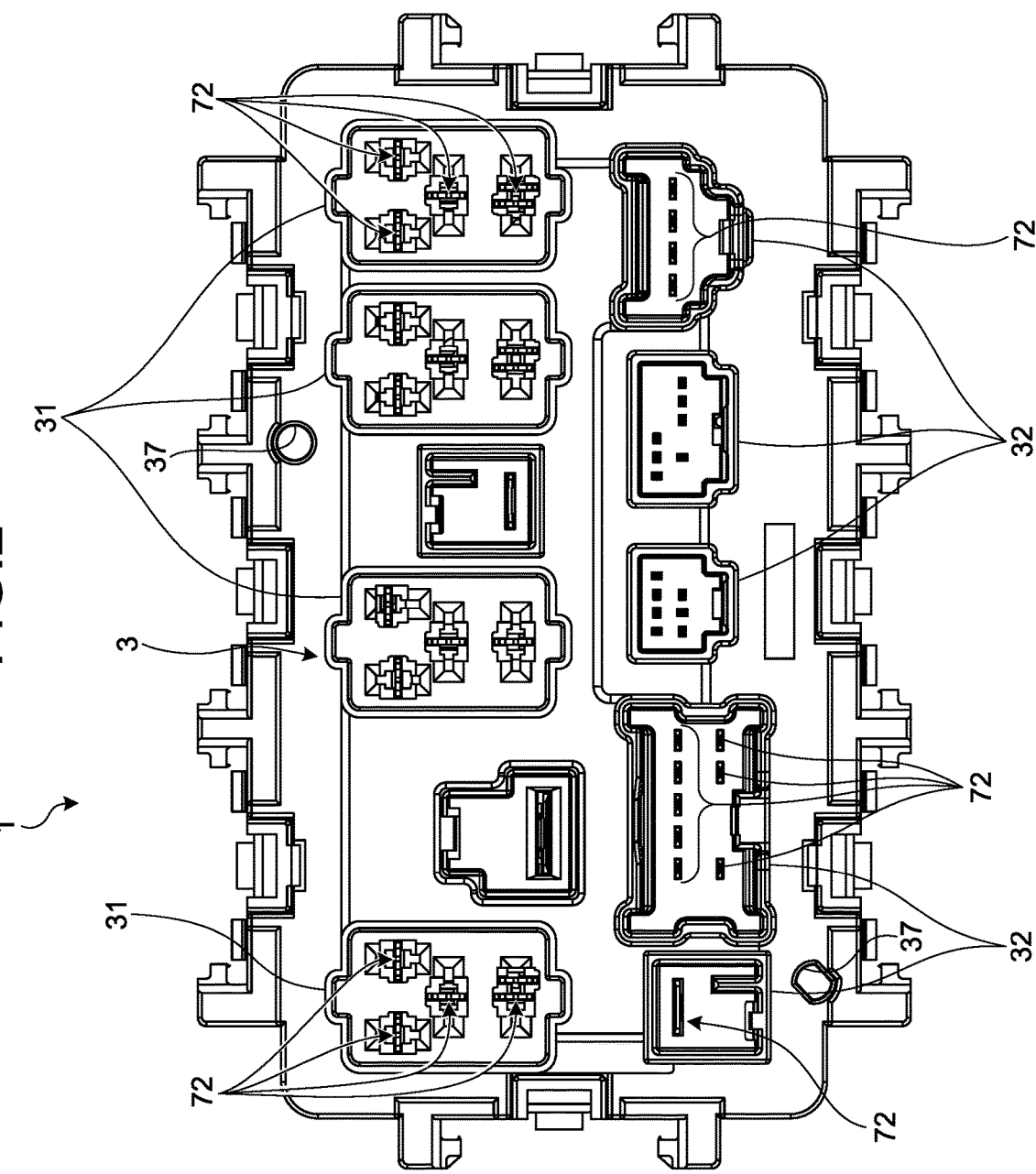
FIG. 2 is a plan view of the electrical connection box according to the embodiment.
Figure 3:
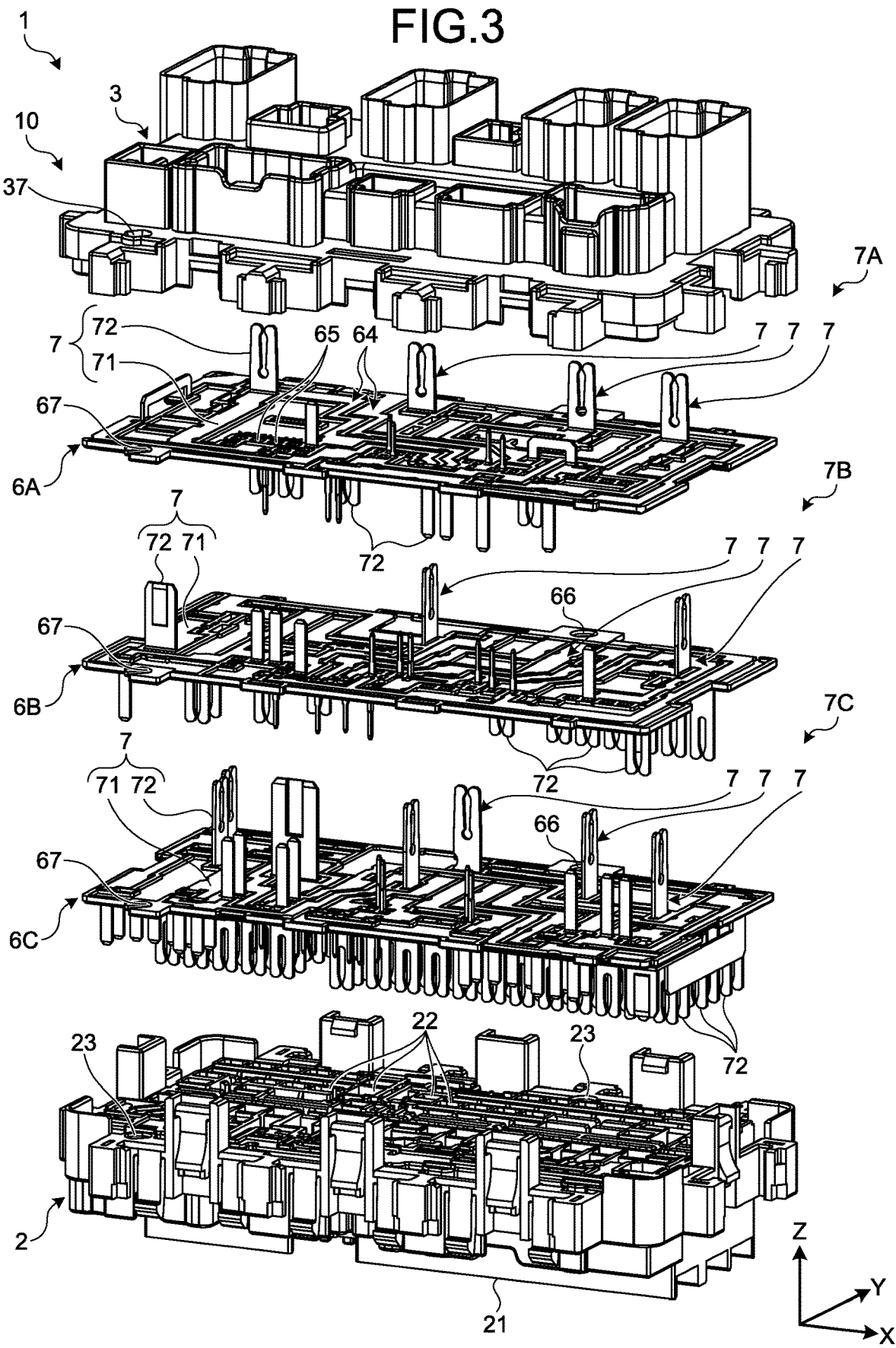
FIG. 3 is an exploded perspective view of the electrical connection box according to the embodiment.
Figure 4:
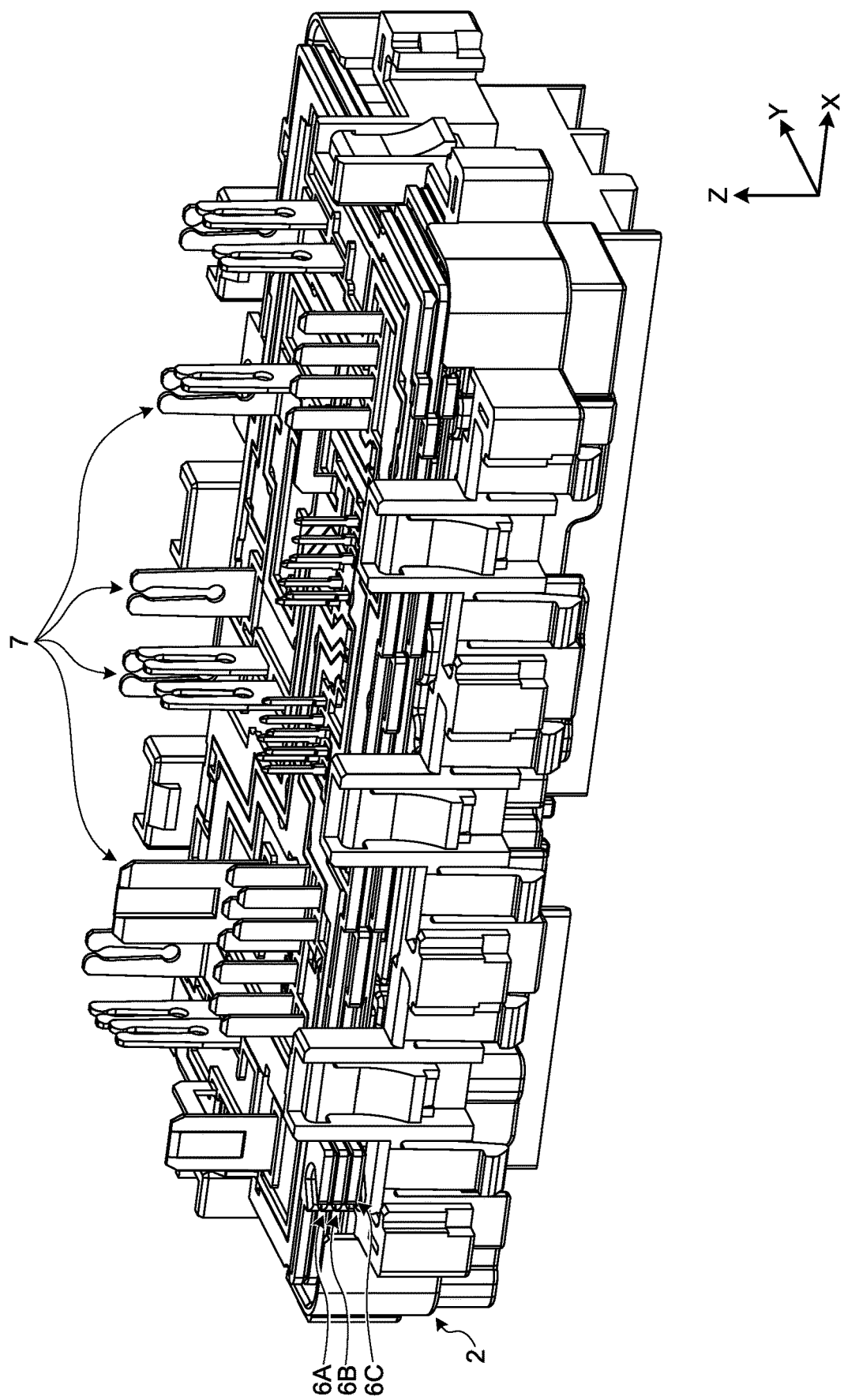
FIG. 4 is a perspective view illustrating the interior of the electrical connection box according to the embodiment.
Figure 5:
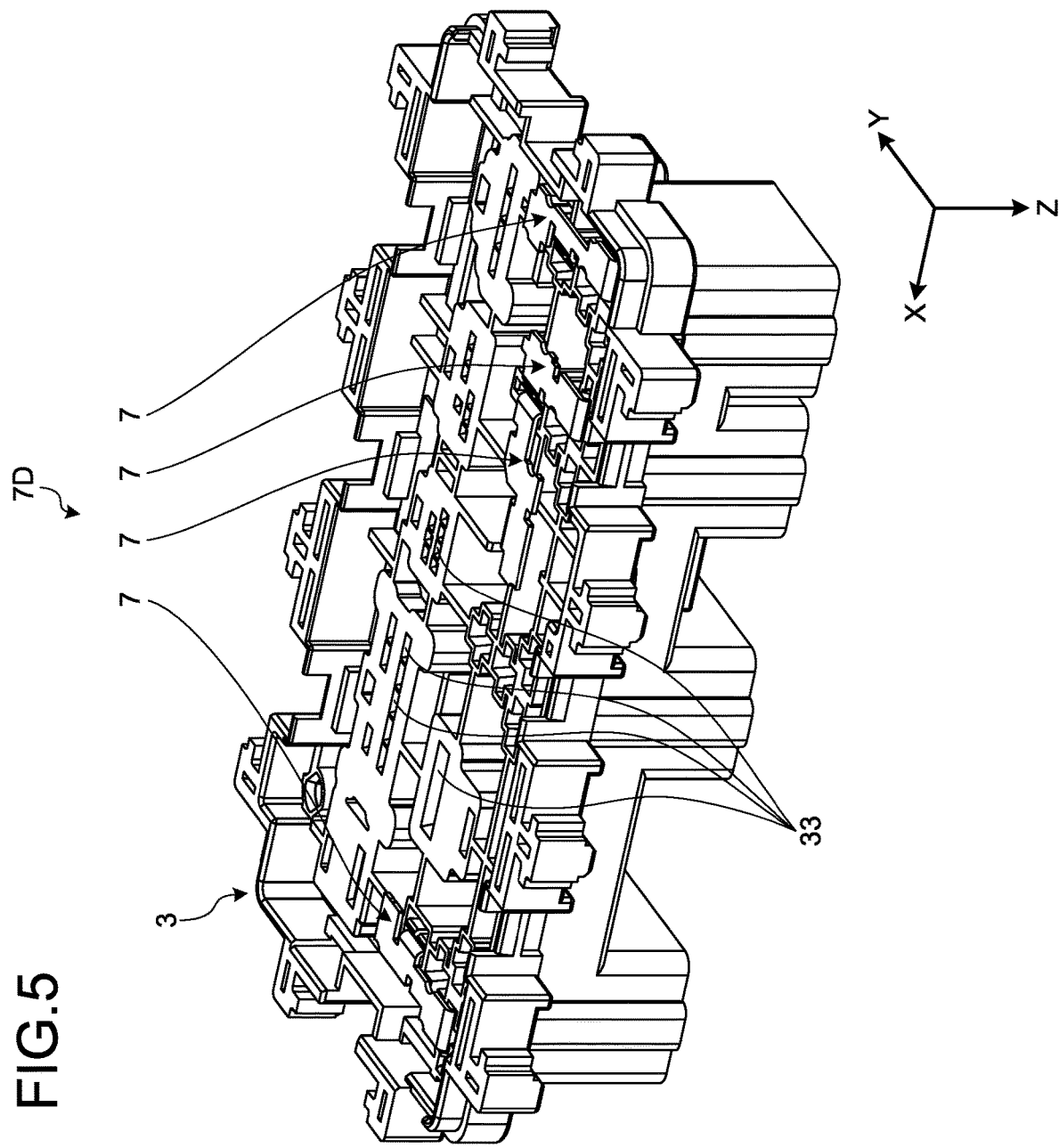
FIG. 5 is a perspective view of a lid according to the embodiment as viewed from a lower surface side.
Figure 6:
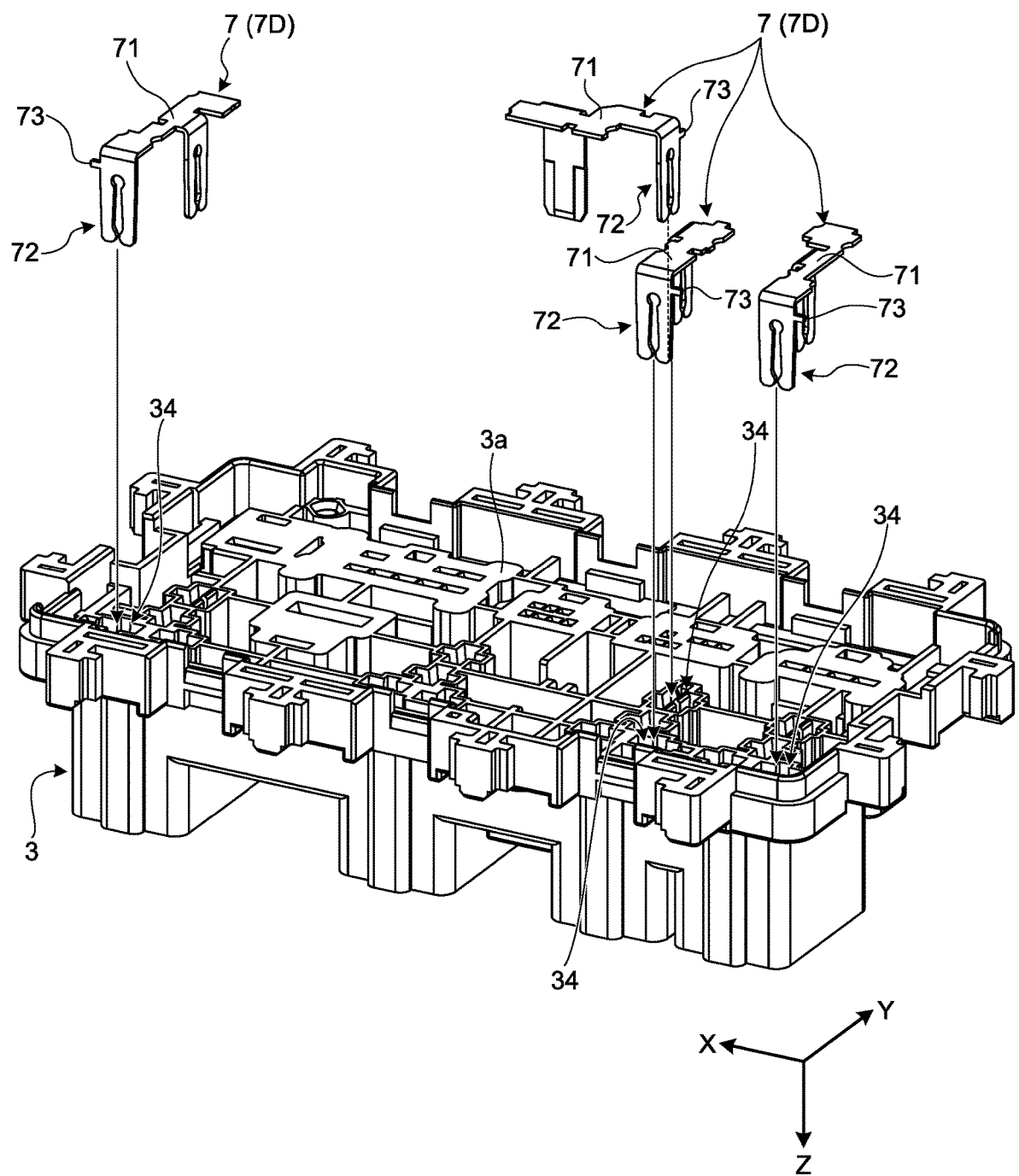
FIG. 6 is a perspective view for describing attachment of a bus bar to the lid.
Figure 7:
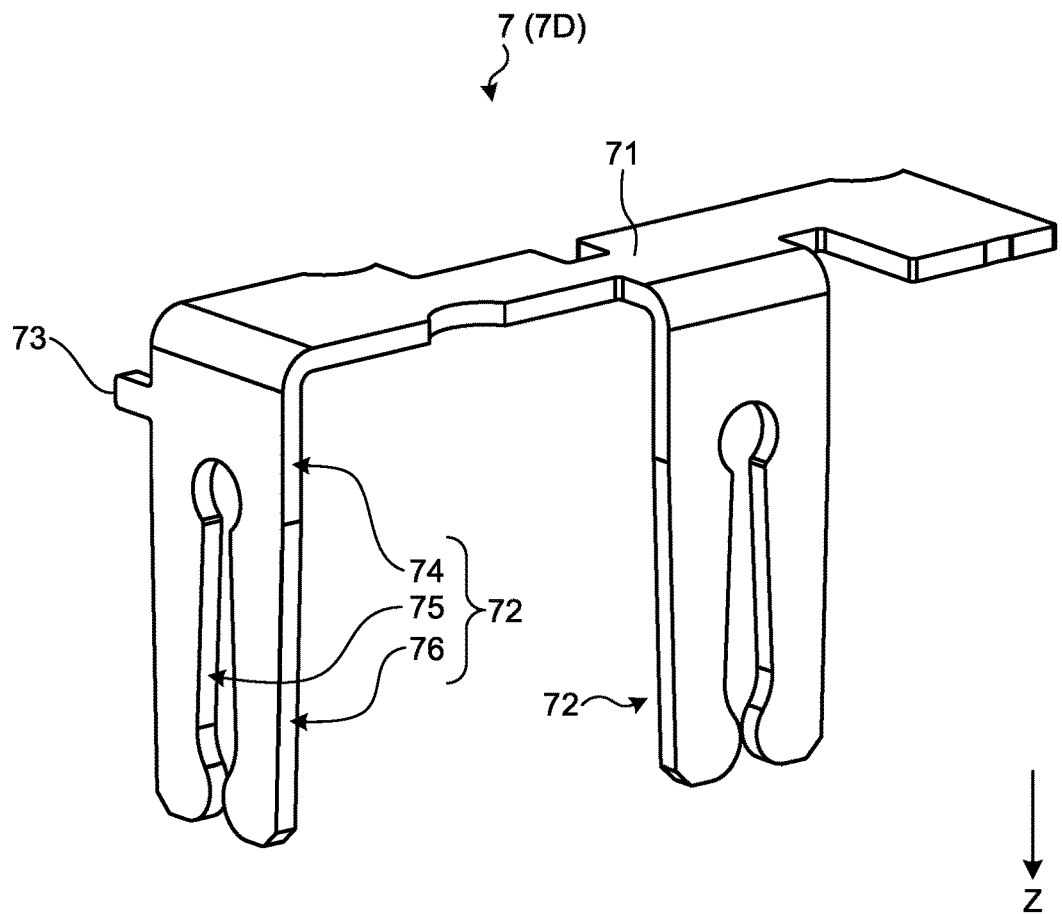
FIG. 7 is a perspective view of the bus bar according to the embodiment.
Figure 8:
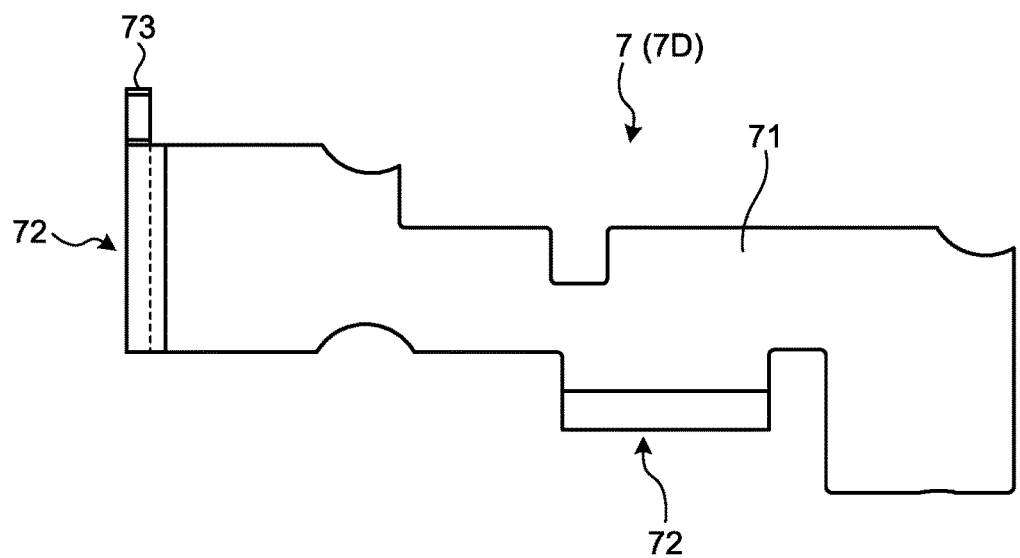
FIG. 8 is a plan view of the bus bar according to the embodiment.
Figure 9:
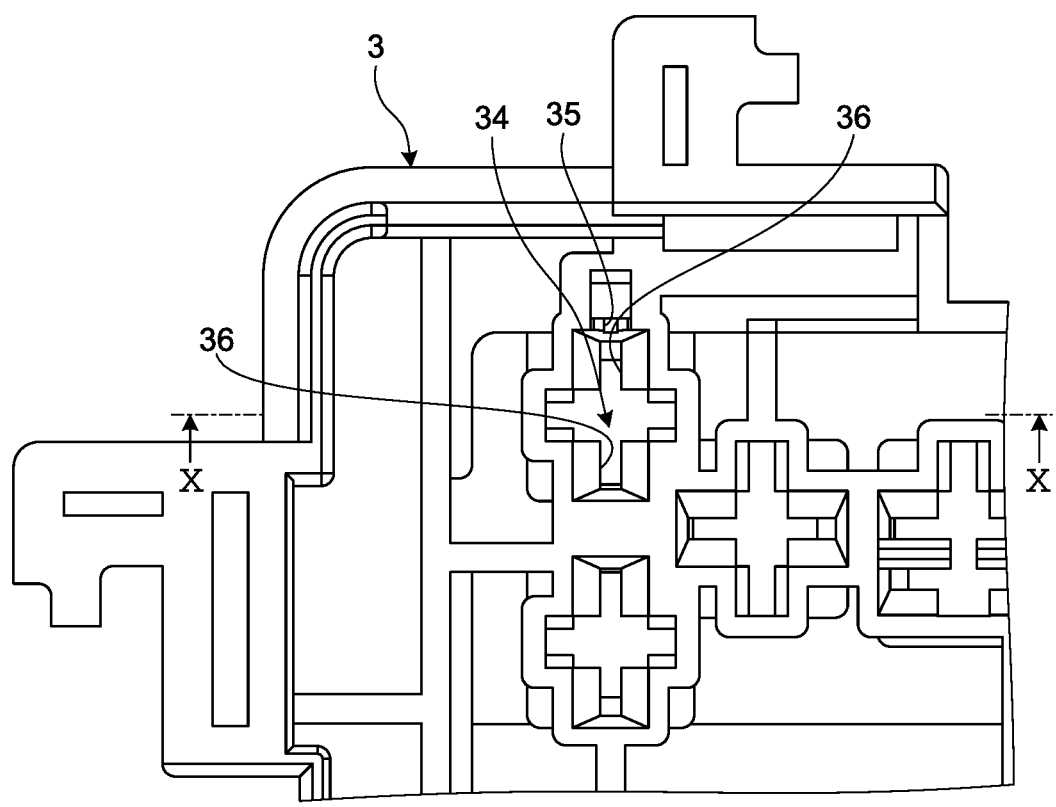
FIG. 9 is a view illustrating a bus bar holding portion according to the embodiment.
Figure 10:
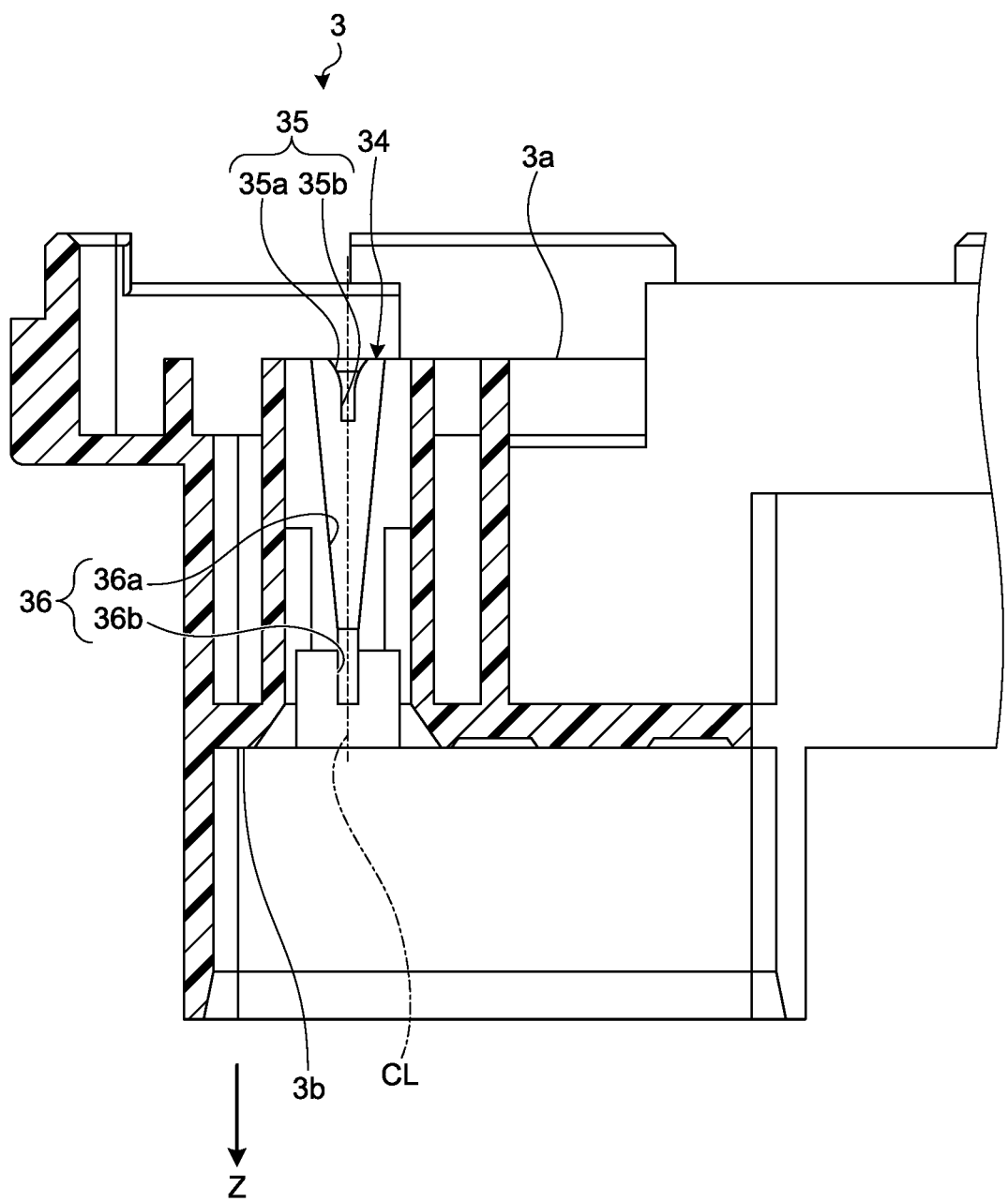
FIG. 10 is a cross-sectional view illustrating the bus bar holding portion according to the embodiment.
Figure 11:
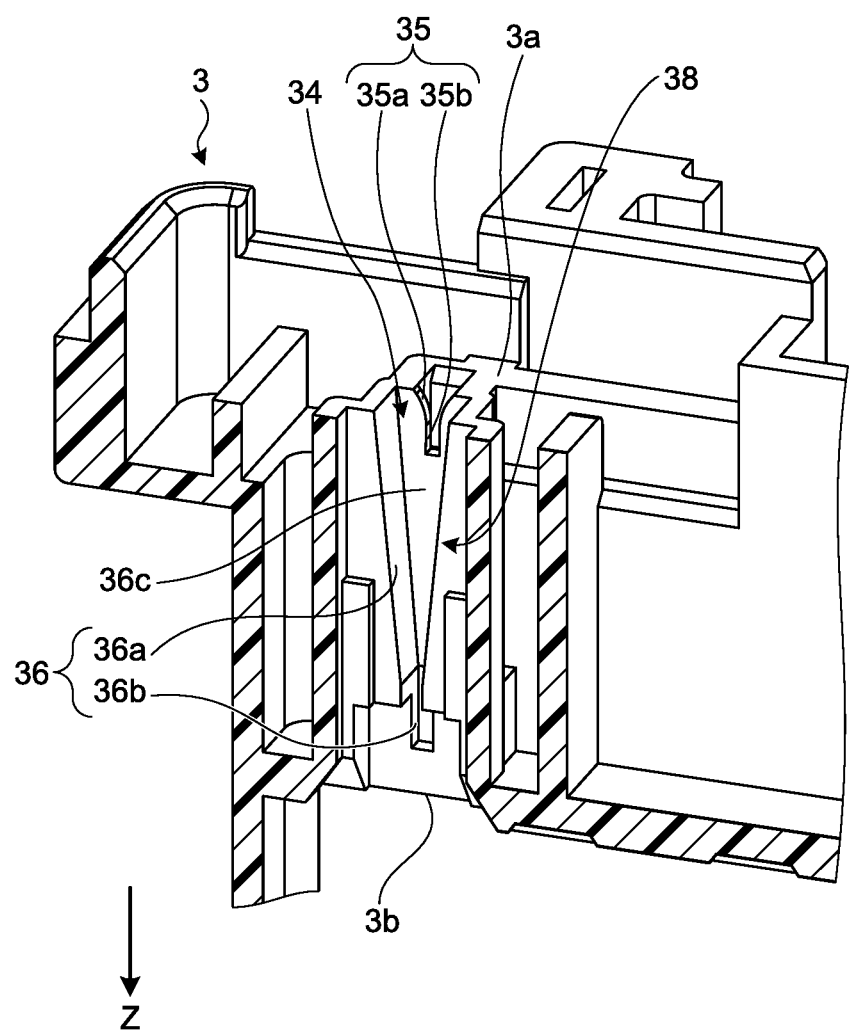
FIG. 11 is a cross-sectional perspective view illustrating the bus bar holding portion according to the embodiment.

An embodiment will be described with reference to FIGS. 1 to 16. The present embodiment relates to an electrical connection box. FIG. 1 is a perspective view illustrating an electrical connection box according to the embodiment; FIG. 2 is a plan view of the electrical connection box according to the embodiment; FIG. 3 is an exploded perspective view of the electrical connection box according to the embodiment; FIG. 4 is a perspective view illustrating the interior of the electrical connection box according to the embodiment; FIG. 5 is a perspective view of a lid according to the embodiment as viewed from the lower surface side; FIG. 6 is a perspective view for describing attachment of a bus bar to the lid; FIG. 7 is a perspective view of the bus bar according to the embodiment; FIG. 8 is a plan view of the bus bar according to the embodiment; FIG. 9 is a view illustrating a bus bar holding portion according to the embodiment; FIG. 10 is a cross-sectional view illustrating the bus bar holding portion according to the embodiment; and FIG. 11 is a cross-sectional perspective view illustrating the bus bar holding portion according to the embodiment. FIG. 10 illustrates a section taken along a line X-X of FIG. 9.

As illustrated in FIG. 1, an electrical connection box 1 according to the present embodiment includes a frame 10. The frame 10 has a frame main body 2 and a lid 3. A shape of the frame 10 of the present embodiment is substantially a rectangular parallelepiped shape. In the description of the electrical connection box 1, a direction of relative movement between the frame main body 2 and the lid 3 when the lid 3 is mounted to the frame main body 2 will be referred to as a "height direction Z". In addition, two directions orthogonal to the height direction Z and orthogonal to each other will be referred to as a "width direction X" and a "depth direction Y", respectively. The width direction X of the present embodiment is a longitudinal direction of the electrical connection box 1. Incidentally, there is a case where the height direction Z is different from a vertical direction of a vehicle in a state where the electrical connection box 1 is mounted on the vehicle.

The electrical connection box 1 is mounted on the vehicle such as an automobile and connects devices mounted on the vehicle to each other. The electrical connection box 1 can form a wire harness together with an electric wire. The electric wire may be connected to the electrical connection box 1 via a connector or the like, or may be directly connected to electronic components inside the electrical connection box 1. The electrical connection box 1 is sometimes referred to as a junction box, a fuse box, a relay box, or the like depending on a type of an electronic component to be accommodated, and these terms will be collectively referred to as the "electrical connection box" in the present embodiment.

The electrical connection box 1 may have a cover in addition to the frame 10. For example, the electrical connection box 1 may have an upper cover that covers the lid 3 and a lower cover that covers the frame main body 2. The frame 10 is formed using an insulating synthetic resin or the like. In addition, the upper cover and the lower cover are formed using the same material as the frame 10, for example.

The frame main body 2 has a holding portion 21 to hold an electronic component. The holding portion 21 is formed on a lower surface of the frame main body 2. The holding portion 21 has a recess to hold the electronic component. The electronic component attached to the holding portion 21 is, for example, a fuse 4.

The lid 3 has a holding portion 31 to hold an electronic component and a connector holding portion 32 to hold the connector. The holding portion 31 and the connector holding portion 32 are formed on an upper surface of the lid 3. The electronic component attached to the holding portion 31 is, for example, a relay 5. The connector connected to a power supply line and a signal line is attached to the connector holding portion 32.

As illustrated in FIG. 2, terminal portions 72 are exposed to bottoms of the holding portion 31 and the connector holding portion 32. The terminal portion 72 is a part of a bus bar 7 to be described later. A terminal of the relay 5 to be attached to the holding portion 31 is physically and electrically connected to the terminal portion 72. The terminal portions 72 sandwich the terminal of the relay 5 to hold the relay 5. A terminal of the connector to be attached to the connector holding portion 32 is physically and electrically connected to the terminal portion 72.

As illustrated in FIG. 3, a plurality of wiring boards 6A, 6B, and 6C and a plurality of the bus bars 7 are accommodated inside the frame 10. The first wiring board 6A, the second wiring board 6B, and the third wiring board 6C are plate-shaped members which are stacked inside the frame 10. A stacking direction of the wiring boards 6A, 6B, and 6C is the height direction Z. The first wiring board 6A is arranged to be closest to the lid 3 side in the stacking direction. The third wiring board 6C is arranged to be closest to the frame main body 2 side in the stacking direction. Shapes of the wiring boards 6A, 6B, and 6C are, for example, substantially rectangular.

The bus bar 7 has a main body 71 and the terminal portion 72. The main body 71 and the terminal portion 72 are integrated. The bus bar 7 is formed by punching or bending a metal plate which is a base material. The main body 71 is a flat plate-shaped constituent portion. The terminal portion 72 is bent in a direction orthogonal to the main body 71, for example. Some of the plurality of bus bars 7 have a so-called tuning-fork terminal as the terminal portion 72.

Figure 12:
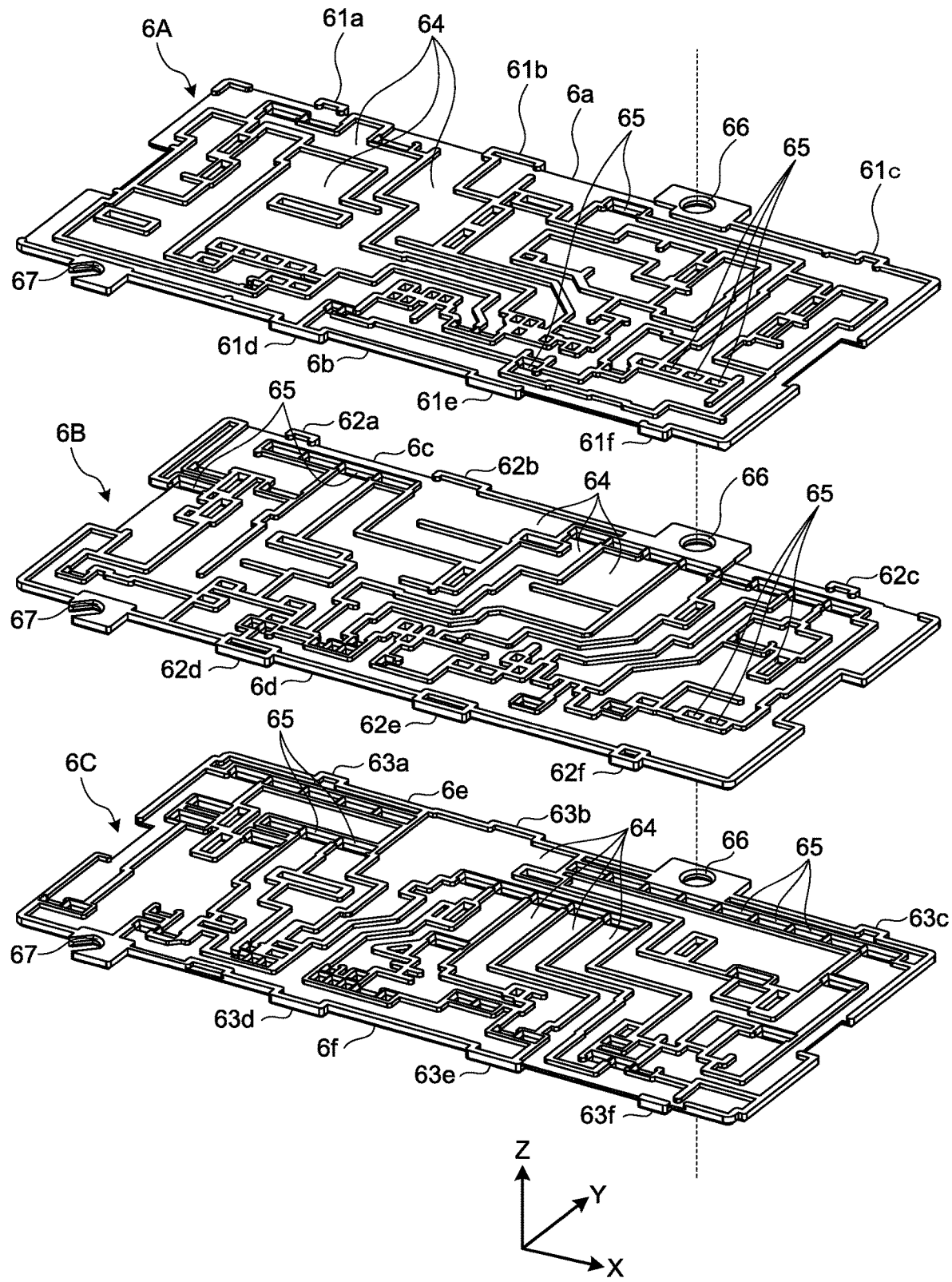
FIG. 12 is a perspective view of a wiring board according to the embodiment.

The plurality of bus bars 7 are arranged in each of the wiring boards 6A, 6B, and 6C. As illustrated in FIGS. 3 and 12, each of the wiring boards 6A, 6B, and 6C has a mounting portion 64 and a through-hole 65. The mounting portion 64 is a recess formed on an upper surface of each of the wiring boards 6A, 6B, and 6C. The main body 71 of the bus bar 7 is mounted on the mounting portion 64. The mounting portion 64 has a shape corresponding to a shape of the main body 71 to be mounted and positions the main body 71. The terminal portion 72 of the bus bar 7 is inserted into the through-hole 65 of each of the wiring boards 6A, 6B, and 6C. The bus bars 7 are attached to the wiring boards 6A, 6B, and 6C so as to mount the main bodies 71 on the upper surfaces of the wiring boards 6A, 6B, and 6C. At this time, the terminal portions 72 of the bus bars 7 are inserted into the through-holes 65 of the wiring boards 6A, 6B, and 6C and protrude toward the frame main body 2 side.

The assembling of the wiring boards 6A, 6B, and 6C and the bus bar 7 with respect to the frame main body 2 is performed as follows, for example. First, the third wiring board 6C is mounted on the upper surface of the frame main body 2. Next, a plurality of the bus bars 7 is attached to the third wiring board 6C. In the following description, the plurality of bus bars 7 attached to the third wiring board 6C will be referred to as a third bus bar group 7C.

Next, the second wiring board 6B is mounted on the third wiring board 6C. At this time, the terminal portion 72 bent toward the lid 3 side is inserted into the through-hole 65 of the second wiring board 6B and protrudes from the second wiring board 6B. Next, a plurality of the bus bars 7 is attached to the second wiring board 6B. In the following description, the plurality of bus bars 7 attached to the second wiring board 6B will be referred to as a second bus bar group 7B.

Next, the first wiring board 6A is mounted on the second wiring board 6B. At this time, the terminal portion 72 bent toward the lid 3 side is inserted into the through-hole 65 of the first wiring board 6A and protrudes from the first wiring board 6A. Next, a plurality of the bus bars 7 is attached to the first wiring board 6A. In the following description, the plurality of bus bars 7 attached to the first wiring board 6A will be referred to as a first bus bar group 7A. When the attachment of the wiring boards 6A, 6B, and 6C and the bus bar groups 7A, 7B, and 7C is completed, the lid 3 is attached to the frame main body 2. The frame main body 2 and the lid 3 are assembled so as to sandwich the wiring boards 6A, 6B, and 6C therebetween.

The attachment of the lid 3 to the frame main body 2 is performed using, for example, a fastening member such as a screw. A through-hole 23 corresponding to the fastening member is formed in the frame main body 2. A through-hole 37 corresponding to the fastening member is formed in the lid 3. Each of the wiring boards 6A, 6B, and 6C has a through-hole 66 and a notch 67 corresponding to the fastening member. The wiring boards 6A, 6B, and 6C are positioned with respect to the frame main body 2 by the through-holes 66 and the notches 67. For example, the wiring boards 6A, 6B, and 6C are mounted on the frame main body 2 in a state where the screws are set to protrude upward from the frame main body 2 in advance. The wiring boards 6A, 6B, and 6C are mounted on the frame main body 2 such that the screws are inserted into the through-holes 66 and the notches 67. The screws guide the wiring boards 6A, 6B, and 6C to predetermined positions.

A through-hole 22 is formed in the frame main body 2. The terminal portion 72 protruding from the third wiring board 6C toward the frame main body 2 side is inserted into the through-hole 22. A distal end of the terminal portion 72 inserted into the through-hole 22 is exposed to an inner space of the holding portion 21.

FIG. 4 illustrates a state where the attachment of the wiring boards 6A, 6B, and 6C and the bus bars 7 to the frame main body 2 is completed. Here, when the bus bar 7 that does not have the terminal portion 72 bent toward the frame main body 2 side is assembled to the frame 10, the following problem arises.

When the bus bar 7 has the terminal portion 72 bent toward the frame main body 2 side with respect to the main body 71 (hereinafter referred to as the "downward terminal portion 72"), the terminal portion 72 is inserted into the through-holes 65 of the wiring boards 6A, 6B, and 6C. Therefore, when the frame main body 2 is conveyed in an assembling process, a shift and a collapse of the bus bar 7 is regulated. When vibration or a force is applied to the bus bar 7, the through-hole 65 supports the downward terminal portion 72 and regulates the shift and collapse of the bus bar 7.

On the other hand, the bus bar 7 that does not have the downward terminal portion 72 is likely to be displaced or collapse when vibration or a force is applied thereto as compared with the bus bar 7 having the downward terminal portion 72.

In the electrical connection box 1 of the present embodiment, the bus bar 7 that does not have the downward terminal portion 72 is held by the lid 3 as will be described below. As a result, the generation of the shift and collapse of the bus bar 7 in the assembling process is suppressed. Accordingly, the electrical connection box 1 of the present embodiment can improve the workability of assembling work.

FIG. 5 is the perspective view of the lid 3 as viewed from the lower surface side. The bus bar 7 is press-fitted into the lid 3. In the present embodiment, the four bus bars 7 are held by the lid 3. In the following description, the bus bar 7 press-fitted into the lid 3 will be referred to as a fourth bus bar group 7D. None of the bus bars 7 of the fourth bus bar group 7D has the downward terminal portion 72. That is, in the bus bars 7 of the fourth bus bar group 7D, all of the terminal portions 72 are bent toward the lid 3 side with respect to the main body 71. Incidentally, the terminal portions 72 of the first bus bar group 7A, the second bus bar group 7B, and the third bus bar group 7C are inserted into through-holes 33 of the lid 3.

As illustrated in FIG. 6, the lid 3 has bus bar holding portions 34. The bus bar holding portions 34 hold the terminal portions 72 of the bus bars 7 belonging to the fourth bus bar group 7D. The bus bar holding portion 34 has an opening on a lower surface 3a of the lid 3 and extends along the height direction Z. The terminal portion 72 of the bus bar 7 is inserted into the bus bar holding portion 34 from the lower surface 3a side.

The bus bars 7 of the fourth bus bar group 7D have protrusions 73. The bus bar holding portion 34 has a holding groove 35 (see FIGS. 9 to 11) corresponding to the protrusion 73. The protrusion 73 is press-fitted into the holding groove 35. The bus bars 7 of the fourth bus bar group 7D are held by the holding grooves 35. The lid 3 holding the bus bars 7 of the fourth bus bar group 7D is assembled to the frame main body 2 (FIG. 4) to which the wiring boards 6A, 6B, and 6C and the bus bar groups 7A, 7B, and 7C have been attached. With such an assembling process, the shift of the bus bar 7 and the collapse of the bus bar 7 are suppressed, thereby improving the workability in the assembling process.

As illustrated in FIGS. 7 and 8, the bus bars 7 of the fourth bus bar group 7D of the present embodiment have so-called tuning fork terminals as the terminal portions 72. The terminal portion 72 has a base 74, a first leg 75, and a second leg 76. The base 74 is a portion of the terminal portion 72 closest to the main body 71. A shape of the base 74 is substantially rectangular. Each of the first leg 75 and the second leg 76 extends from the base 74 in the height direction Z. A plate thickness from the base 74 to distal ends of the first leg 75 and the second leg 76 is, for example, constant. The first leg 75 and the second leg 76 oppose each other with a gap in the width direction of the terminal portion 72. The terminals of the electronic component and the connector are sandwiched between the first leg 75 and the second leg 76. The first leg 75 and the second leg 76 sandwich and hold a mating terminal.

The protrusion 73 protrudes laterally from a side surface of the terminal portion 72. The protrusion 73 of the present embodiment is arranged on the base 74. The protrusion 73 is formed, for example, at ends of the base 74 on sides of the legs 75 and 76. A shape of the protrusion 73 is, for example, rectangular. A plate thickness of the protrusion 73 is the same as the plate thickness of the terminal portion 72. When the bus bar 7 has a plurality of the terminal portions 72, the protrusion 73 is provided in at least one of the plurality of terminal portions 72. The protrusions 73 may be provided in each of the plurality of terminal portions 72.

As illustrated in FIGS. 9 to 11, the bus bar holding portion 34 penetrates through the lid 3 along the height direction Z. That is, the bus bar holding portion 34 is a through-hole extending from the lower surface 3a to an upper surface 3b of the lid 3. The bus bar holding portion 34 has the holding groove 35 and a pair of guide grooves 36. The pair of guide grooves 36 guides the terminal portion 72. More specifically, one guide groove 36 of the pair of guide grooves 36 guides the first leg 75, and the other guide groove 36 guides the second leg 76. The guide groove 36 extends in the height direction Z from the lower surface 3a to the upper surface 3b along the height direction Z.

As illustrated in FIGS. 10 and 11, the guide groove 36 has a tapered portion 36a and a straight portion 36b. The tapered portion 36a is a portion on an inlet side of the guide groove 36. The tapered portion 36a has a groove width that becomes narrower from the lower surface 3a toward the upper surface 3b. In the tapered portion 36a, each of a pair of wall surfaces forming the guide groove 36 is inclined with respect to the height direction Z. The straight portion 36b is formed to be closer to the upper surface 3b than the tapered portion 36a. The straight portion 36b has a constant groove width. That is, a pair of wall surfaces forming the guide groove 36 is parallel in the straight portion 36b. The groove width of the straight portion 36b is slightly larger than the plate thickness of the terminal portion 72, for example.

The terminal portion 72 is inserted into the bus bar holding portion 34 from the distal end side. The first leg 75 and the second leg 76 are guided to the straight portion 36b by the tapered portion 36a and inserted into the straight portion 36b. As the first leg 75 and the second leg 76 are inserted into the straight portion 36b, positioning of the terminal portion 72 is performed. That is, the straight portion 36b sets an attitude of the terminal portion 72 to an attitude parallel with the height direction Z.

The holding groove 35 is formed in the vicinity of the guide groove 36. More specifically, the holding groove 35 is formed in a wall portion 38 opposing the side surface of the terminal portion 72. The wall portion 38 is one of a plurality of wall portions forming the bus bar holding portion 34 and opposes the side surface of the terminal portion 72 to be inserted into the bus bar holding portion 34. The guide groove 36 is formed in the wall portion 38. The holding groove 35 is formed in a bottom surface 36c of the guide groove 36. That is, the guide groove 36 is formed as a first-stage groove with respect to the wall portion 38, and the holding groove 35 is formed as a second-stage groove.

The holding groove 35 extends along the height direction Z from the lower surface 3a toward the upper surface 3b. The holding groove 35 has a tapered portion 35a and a straight portion 35b. The tapered portion 35a is a portion on an inlet side of the holding groove 35. The tapered portion 35a has a groove width that becomes narrower from the lower surface 3a toward the upper surface 3b. In the tapered portion 35a, each of a pair of wall surfaces forming the holding groove 35 is inclined with respect to the height direction Z. The straight portion 35b is formed to be closer to the upper surface 3b than the tapered portion 35a. The straight portion 35b has a constant groove width. That is, a pair of wall surfaces forming the holding groove 35 is parallel in the straight portion 35b. The groove width of the straight portion 35b is slightly smaller than the plate thickness of the protrusion 73, for example.

When the terminal portion 72 is inserted into the bus bar holding portion 34, the protrusion 73 is press-fitted into the holding groove 35. The protrusion 73 is guided to the straight portion 35b by the tapered portion 35a and press-fitted into the straight portion 35b. A length of the straight portion 35b along the height direction Z is equal to a length of the protrusion 73, for example. The straight portion 35b holds the bus bar 7 by sandwiching the protrusion 73 from both sides in a plate thickness direction.

As illustrated in FIG. 10, when the guide groove 36 and the holding groove 35 are viewed from the front side, center lines CL of the guide groove 36 and the holding groove 35 overlap each other. Accordingly, the attitude of the terminal portion 72 is set to an upright attitude by inserting the terminal portion 72 into the straight portion 36b, and the protrusion 73 is easily inserted into the holding groove 35.

Figure 13:
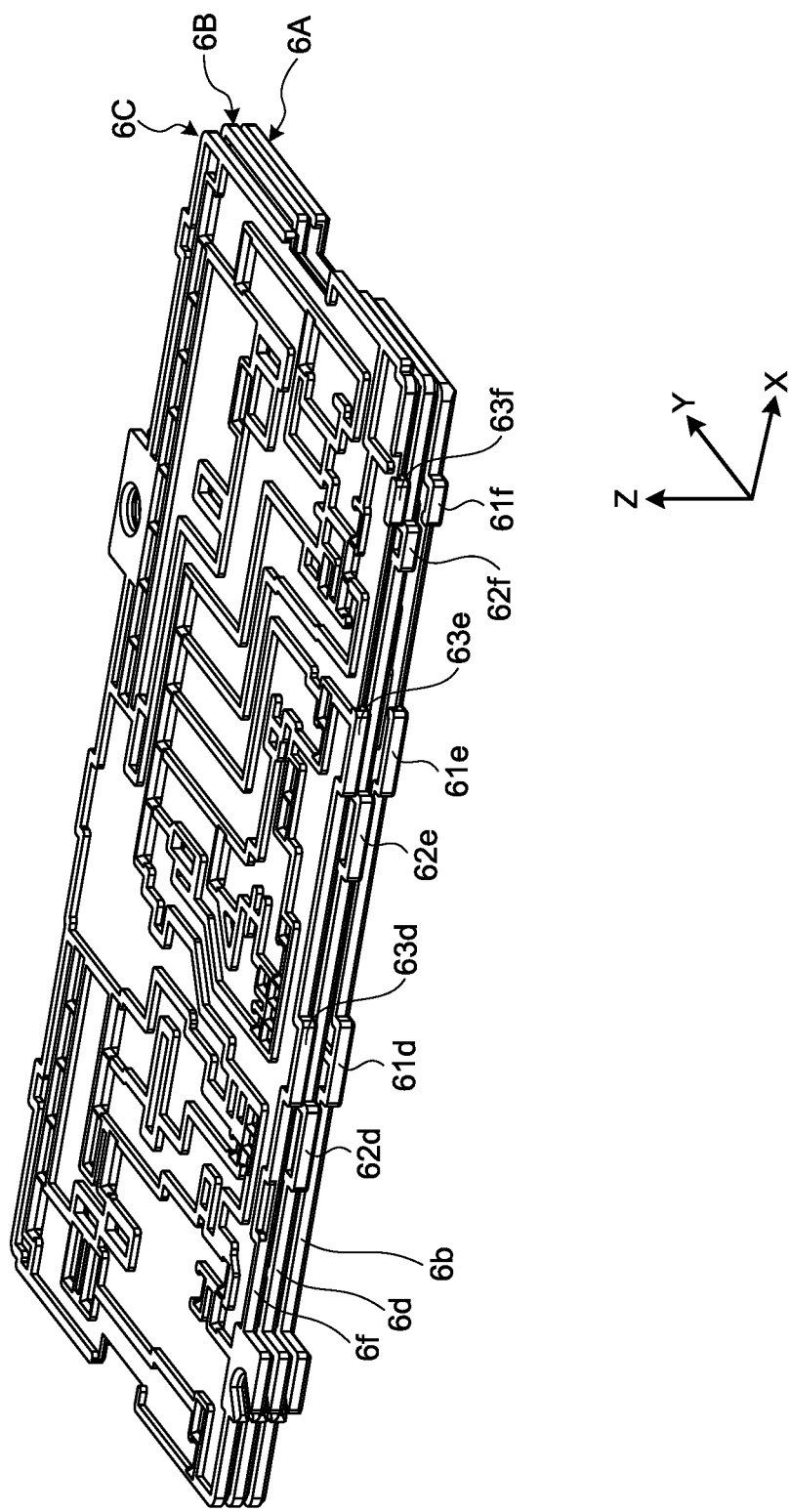
FIG. 13 is a perspective view illustrating a stacked state of the wiring boards according to the embodiment.

A method of assembling the frame 10 will be described with reference to FIGS. 12 to 15. As described above, the first wiring board 6A, the second wiring board 6B, and the third wiring board 6C are arranged in the frame 10 to be stacked in this order. When the wiring boards 6A, 6B, and 6C are assembled to the frame main body 2, the wiring boards 6A, 6B, and 6C stacked in the reverse order thereof are supplied to an assembly line. That is, the first wiring board 6A is arranged at the lowermost side and the third wiring board 6C is arranged at the uppermost side as illustrated in FIG. 13. The second wiring board 6B is sandwiched between the first wiring board 6A and the third wiring board 6C. An assembling apparatus arranged in the assembly line has a conveyance mechanism 50 illustrated in FIG. 14.

Figure 14:
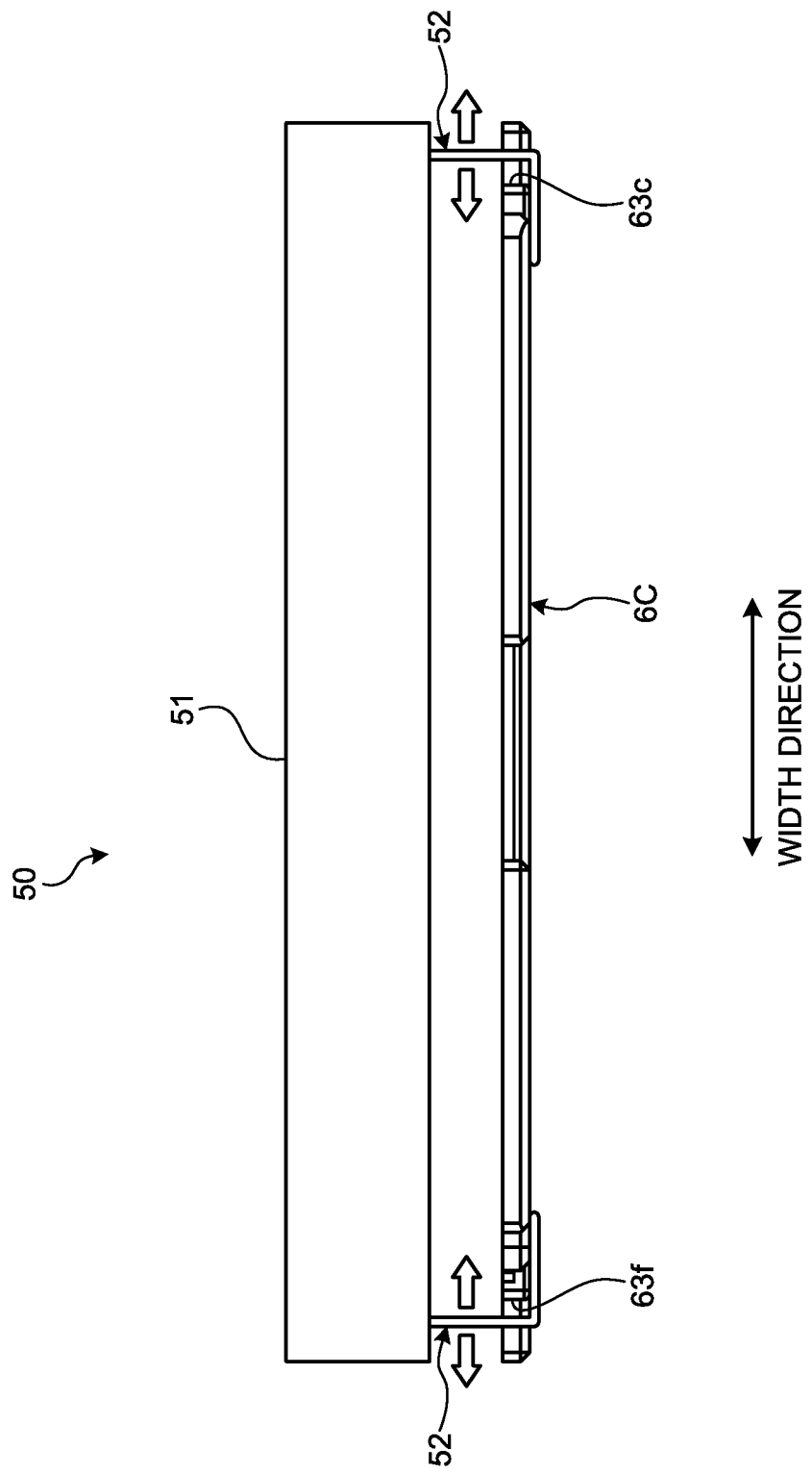
FIG. 14 is a view illustrating a conveyance mechanism according to the embodiment.

As illustrated in FIG. 14, the conveyance mechanism 50 has a movable main body 51 and a plurality of holding claws 52. The main body 51 is positioned at an arbitrary position by an arm (not illustrated) or the like. The holding claw 52 protrudes from the main body 51 and is relatively movable in the width direction with respect to the main body 51. The main body 51 has a drive device configured to drive the holding claw 52. The holding claw 52 is bent in an L-shape.

As illustrated in FIG. 12, the wiring boards 6A, 6B, and 6C have a plurality of protrusions held by the holding claws 52. The first wiring board 6A has a first protrusion 61a, a second protrusion 61b, a third protrusion 61c, a fourth protrusion 61d, a fifth protrusion 61e, and a sixth protrusion 61f. The first protrusion 61a, the second protrusion 61b, and the third protrusion 61c are arranged on a first side 6a of the first wiring board 6A in this order. The first protrusion 61a is arranged at one end of the first side 6a, and the third protrusion 61c is arranged at the other end of the first side 6a. The second protrusion 61b is arranged at the center of the first side 6a.

The fourth protrusion 61d, the fifth protrusion 61e, and the sixth protrusion 61f are arranged on a second side 6b of the first wiring board 6A in this order. The fourth protrusion 61d is arranged at one end of the second side 6b, and the sixth protrusion 61f is arranged at the other end of the second side 6b. The fifth protrusion 61e is arranged at the center of the second side 6b. The first side 6a and the second side 6b are long sides of the first wiring board 6A, and have a relationship of opposite sides to each other.

The second wiring board 6B has a first protrusion 62a, a second protrusion 62b, a third protrusion 62c, a fourth protrusion 62d, a fifth protrusion 62e, and a sixth protrusion 62f. The first protrusion 62a, the second protrusion 62b, and the third protrusion 62c are arranged on a first side 6c of the second wiring board 6B in this order. The first protrusion 62a is arranged at one end of the first side 6c, and the third protrusion 62c is arranged at the other end of the first side 6c. The second protrusion 62b is arranged at the center of the first side 6c.

The fourth protrusion 62d, the fifth protrusion 62e, and the sixth protrusion 62f are arranged on a second side 6d of the second wiring board 6B in this order. The fourth protrusion 62d is arranged at one end of the second side 6d, and the sixth protrusion 62f is arranged at the other end of the second side 6d. The fifth protrusion 62e is arranged at the center of the second side 6d. The first side 6c and the second side 6d are long sides of the second wiring board 6B, and have a relationship of opposite sides to each other.

The third wiring board 6C has a first protrusion 63a, a second protrusion 63b, a third protrusion 63c, a fourth protrusion 63d, a fifth protrusion 63e, and a sixth protrusion 63f. The first protrusion 63a, the second protrusion 63b, and the third protrusion 63c are arranged on a first side 6e of the third wiring board 6C in this order. The first protrusion 63a is arranged at one end of the first side 6e, and the third protrusion 63c is arranged at the other end of the first side 6e. The second protrusion 63b is arranged at the center of the first side 6e.

The fourth protrusion 63d, the fifth protrusion 63e, and the sixth protrusion 63f are arranged on a second side 6f of the third wiring board 6C in this order. The fourth protrusion 63d is arranged at one end of the second side 6f, and the sixth protrusion 63f is arranged at the other end of the second side 6f. The fifth protrusion 63e is arranged at the center of the second side 6f. The first side 6e and the second side 6f are long sides of the third wiring board 6C, and have a relationship of opposite sides to each other.

As illustrated in FIG. 13, the respective protrusions are arranged alternately in a plan view when the wiring boards 6A, 6B, and 6C are stacked. For example, the three fourth protrusions 61d, 62d, and 63d are alternately arranged in a direction along the second side 6b. More specifically, a position of the fourth protrusion 61d of the first wiring board 6A and a position of the fourth protrusion 62d of the second wiring board 6B are shifted from each other in the width direction X. The position of the fourth protrusion 62d of the second wiring board 6B and a position of the fourth protrusion 63d of the third wiring board 6C are shifted from each other in the width direction X. Further, the fourth protrusion 61d of the first wiring board 6A and the fourth protrusion 63d of the third wiring board 6C oppose each other in the height direction Z.

As the three fourth protrusions 61d, 62d, and 63d are arranged to be shifted from each other in such a manner, the holding claws 52 can be easily inserted into lower sides of the fourth protrusions 61d, 62d, and 63d. Each shift amount of the fourth protrusions 61d, 62d, and 63d in the width direction X is set to a size that enables at least insertion of the holding claw 52.

Figure 15:
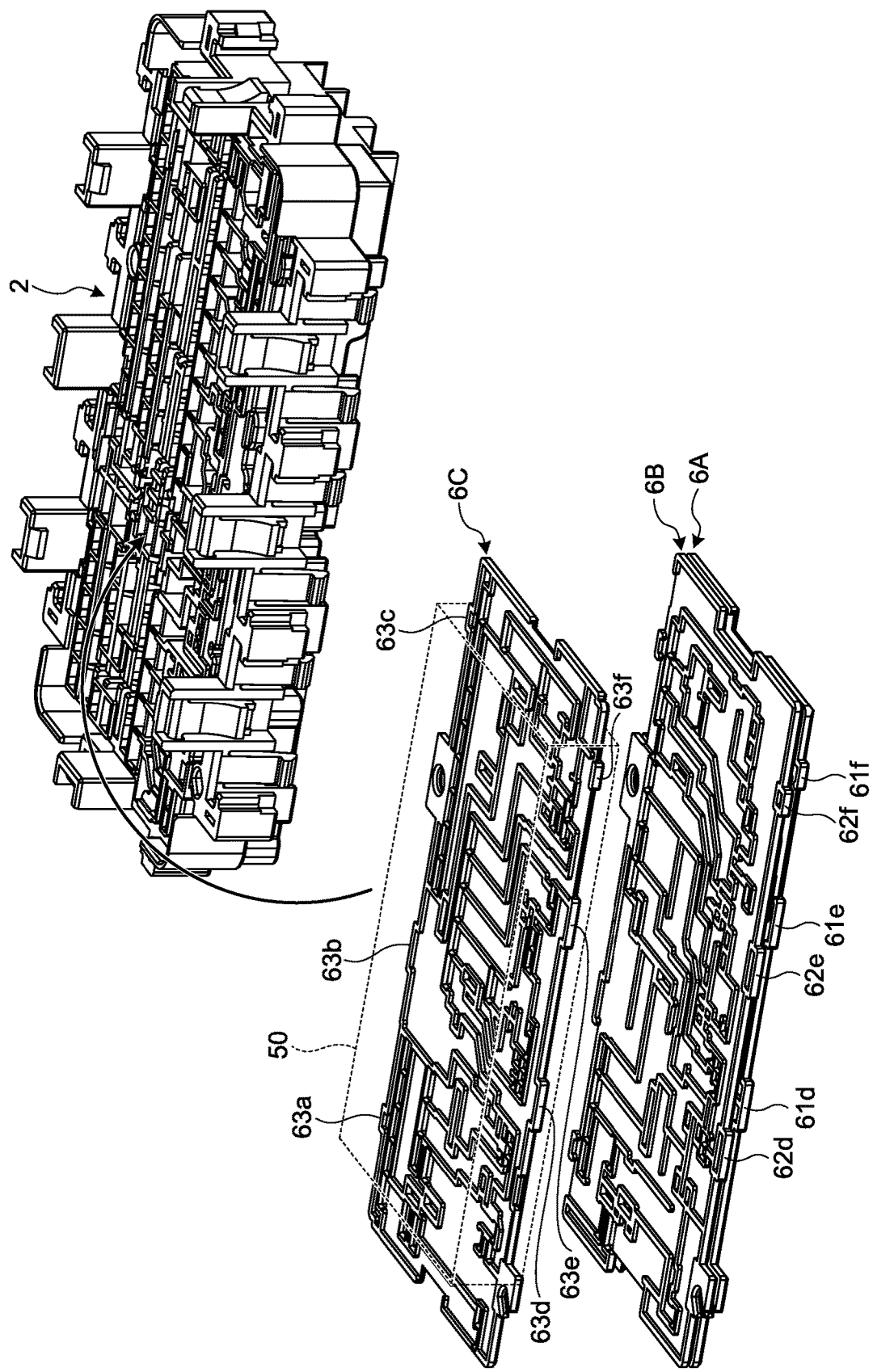
FIG. 15 is a perspective view for describing conveyance of the wiring board by the conveyance mechanism.
Figure 16:
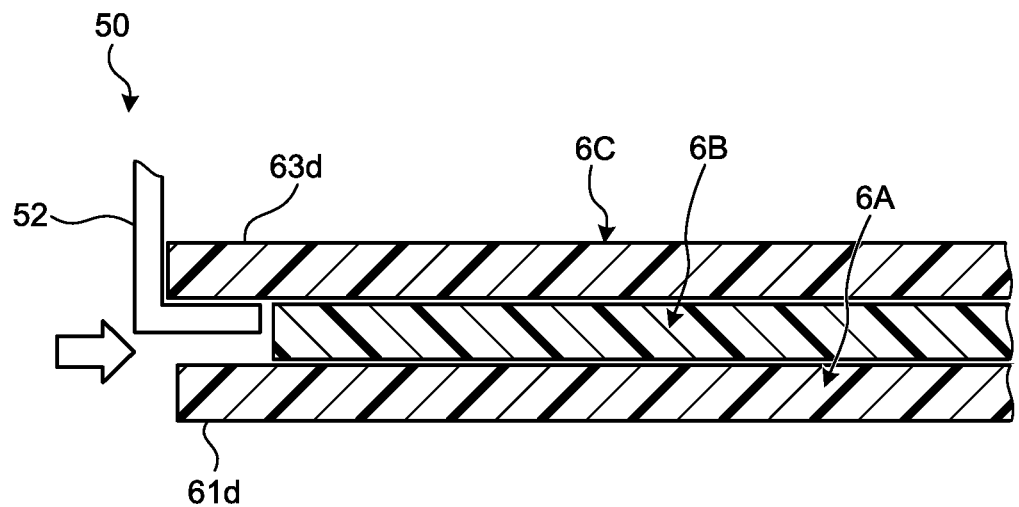
FIG. 16 is a cross-sectional view for describing conveyance of the wiring board by the conveyance mechanism.

As illustrated in FIG. 15, the conveyance mechanism 50 holds and conveys the third wiring board 6C first out of the stacked wiring boards 6A, 6B, and 6C. When holding the third wiring board 6C, a distal end of the holding claw 52 is inserted into a lower side of each protrusion of the third wiring board 6C. For example, the single holding claw 52 is inserted into the lower side of the fourth protrusion 63d as illustrated in FIG. 16. Since the fourth protrusions 61d, 62d, and 63d are alternately arranged, there is a gap between the fourth protrusion 63d and the fourth protrusion 61d. The holding claw 52 is inserted into this gap to support the fourth protrusion 63d from the lower side.

The conveyance mechanism 50 causes the held third wiring board 6C to be mounted on the upper surface of the frame main body 2 as illustrated in FIG. 15. Each of the bus bars 7 of the third bus bar group 7C is mounted on the third wiring board 6C. When the mounting of the bus bars 7 is completed, the conveyance mechanism 50 holds the second wiring board 6B to be mounted on the third wiring board 6C. Since the protrusions 61a to 61f, 62a to 62f, and 63a to 63f of the wiring boards 6A, 6B and 6C are alternately arranged in the present embodiment, the holding claw 52 hardly interferes with the protruding portion when mounting the wiring boards 6A, 6B and 6C on the frame main body 2. For example, when the second wiring board 6B is mounted on the third wiring board 6C mounted on the frame main body 2, the holding claw 52 holding the fourth protrusion 62d of the second wiring board 6B hardly interferes with the fourth protrusion 63d of the third wiring board 6C.

The respective bus bars 7 of the second bus bar group 7B are mounted on the mounted second wiring board 6B. When the mounting of the bus bars 7 is completed, the conveyance mechanism 50 holds the first wiring board 6A to be mounted on the second wiring board 6B. Each of the bus bars 7 of the first bus bar group 7A is mounted on the first wiring board 6A.

On the other hand, the bus bars 7 of the fourth bus bar group 7D are assembled to the lid 3. The lid 3 holding the bus bars 7 of the fourth bus bar group 7D is attached to the frame main body 2 to which the wiring boards 6A, 6B, and 6C and the bus bar groups 7A, 7B, and 7C have been mounted. The frame main body 2 and the lid 3 are fastened by the fastening member. Through the above process, the assembling of the wiring boards 6A, 6B, and 6C and the bus bar 7 with respect to the frame 10 is completed.

As described above, the electrical connection box 1 according to the present embodiment includes the frame main body 2, the lid 3, the wiring boards 6A, 6B, and 6C, and the bus bar 7. The lid 3 is assembled to the frame main body 2 to form the frame 10. The wiring boards 6A, 6B, and 6C are the plate-shaped members sandwiched between the frame main body 2 and the lid 3. The bus bar 7 has the main body 71 arranged on the surface of each of the wiring boards 6A, 6B, and 6C and the terminal portion 72 bent from the main body 71 toward the lid 3.

The bus bar 7 of the present embodiment has the protrusion 73 protruding from the side surface of the terminal portion 72. The lid 3 has the bus bar holding portion 34 into which the terminal portion 72 is inserted. In the bus bar holding portion 34, the wall portion 38 opposing the side surface of the terminal portion 72 has the holding groove 35 into which the protrusion 73 is press-fitted. As the protrusion 73 is press-fitted into the holding groove 35, the bus bar 7 is held by the lid 3. As the bus bar 7 is held by the lid 3, it is possible to prevent the shift and collapse of the bus bar 7 arranged in the frame main body 2 in advance. That is, it is possible to improve the workability of assembling work by causing the lid 3 to hold the bus bar 7 which is liable to be unstable in the case of being mounted on the frame main body 2. In addition, it is possible to suppress generation of a defective product caused by assembling without noticing the collapse of the bus bar 7.

According to the configuration of the present embodiment, it is possible to minimize a dimensional error between the protrusion 73 and the holding groove 35. For example, when the protrusion 73 is provided on the main body 71 of the bus bar 7 as a comparative example, tolerance in punching or the like is likely to be large. As a result, a positional shift between the protrusion 73 and the holding groove 35 and a dimensional error in a groove width direction are likely to occur. On the other hand, in the case where the protrusion 73 is provided on the side face of the terminal portion 72 as in the present embodiment, tolerance in the groove width direction of the protrusion 73 is tolerance in the plate thickness and is sufficiently small. Accordingly, the dimensional error in the groove width direction between the protrusion 73 and the holding groove 35 is minimized according to the present embodiment.

In the electrical connection box 1 of the present embodiment, all the terminal portions 72 bent with respect to the main body 71 are bent toward the lid 3 side in the bus bar 7 having the protrusions 73. The bus bar 7 that does not have the terminal portion 72 bent toward the frame main body 2 is likely to be unstable when being mounted on the wiring board 6A and conveyed along the line. It is possible to improve the workability of assembling work by holding this bus bar 7 by the lid 3.

In the electrical connection box 1 of the present embodiment, the plurality of wiring boards 6A, 6B, and 6C are arranged to be stacked between the frame main body 2 and the lid 3. The wiring boards 6A, 6B, and 6C are stacked such that the protrusions 61a to 61f, 62a to 62f, and 63a to 63f are alternate. Accordingly, the protrusions 61a to 61f, 62a to 62f, and 63a to 63f can be easily held by the holding claws 52 of the conveyance mechanism 50. Even if there occurs somewhat warpage in the wiring boards 6A, 6B, and 6C due to the presence of the gaps below the protrusions 61a to 61f, 62a to 62f, and 63a to 63f, it is possible to easily hold the wiring boards 6A, 6B, and 6C.

As a comparative example, it is assumed that the wiring boards 6A, 6B, and 6C are conveyed in the state of being sucked by suction pads. In this case, when warping deformation occurs in the wiring boards 6A, 6B, and 6C, it is difficult to adequately suck the wiring boards 6A, 6B, and 6C in some cases. On the other hand, the wiring boards 6A, 6B, and 6C of the present embodiment can be stably conveyed even if warping deformation occurs.

The protrusion 73 of the present embodiment is arranged at a base end of the terminal portion 72. Therefore, it is possible to easily confirm whether the protrusion 73 is properly press-fitted into the holding groove 35 with visual observation.

In the bus bar holding portion 34 of the present embodiment, the wall portion 38 opposing the side surface of the terminal portion 72 further has the guide groove 36 to guide the terminal portion 72. When the wall portion 38 is viewed from the front side, the center line CL of the holding groove 35 and the center line CL of the guide groove 36 overlap each other. With such an arrangement, when the terminal portion 72 is inserted into the bus bar holding portion 34, the protrusion 73 is automatically guided to the holding groove 35.

First Modification of Embodiment

Figure 17:
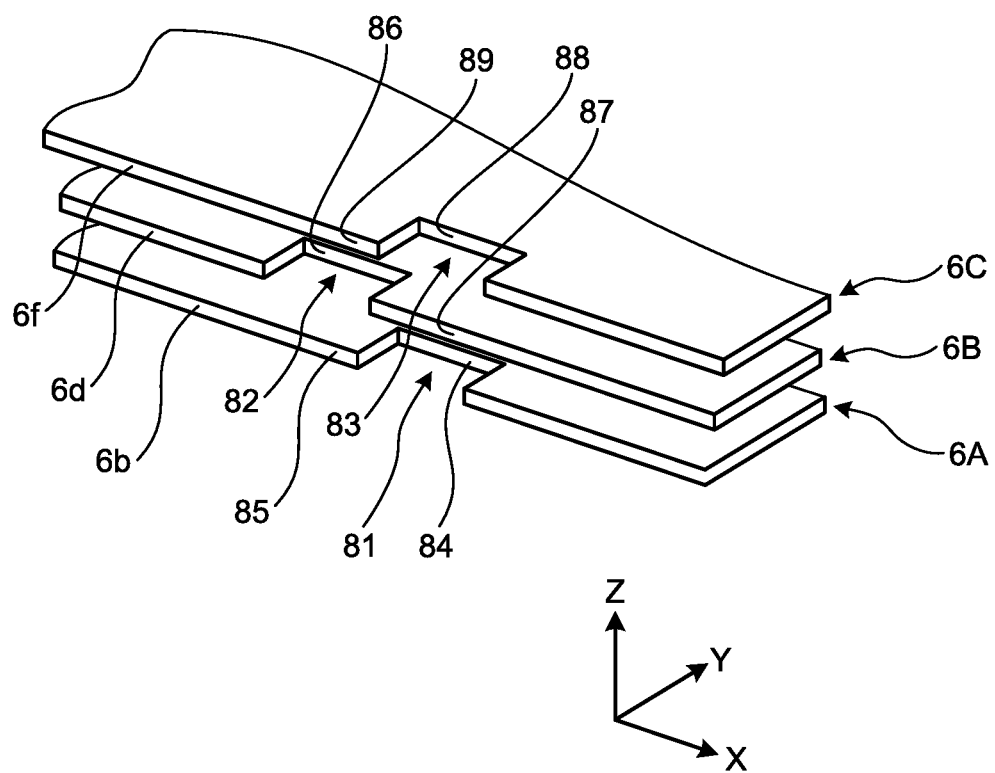
FIG. 17 is a perspective view illustrating a wiring board according to a first modification of the embodiment.

A first modification of the embodiment will be described with reference to FIG. 17. FIG. 17 is a perspective view illustrating a wiring board according to the first modification of the embodiment. As illustrated in FIG. 17, recesses may be formed alternately in the wiring boards 6A, 6B, and 6C. A recess 81 is formed in the first wiring board 6A. Similarly, a recess 82 and a recess 83 are formed in the second wiring board 6B and the third wiring board 6C, respectively. Shapes of the recesses 81, 82, and 83 are, for example, rectangular. The recess 81 and the recess 83 oppose each other in the thickness direction of the wiring boards 6A, 6B, and 6C. In the width direction X, the recess 82 of the second wiring board 6B is arranged to be shifted from the recesses 81 and 83.

In the first wiring board 6A, a stepped portion is formed in a portion where the recess 81 is formed. In the stepped portion, a first edge 84 and a second edge 85 are formed to be adjacent to each other. The first edge 84 is a bottom side portion of the recess 81. The second edge 85 is a portion adjacent to the recess 81 in the second side 6b.

Similarly, a stepped portion is formed in a portion where the recess 82 is formed in the second wiring board 6B. In the stepped portion, a first edge 86 and a second edge 87 are formed to be adjacent to each other. In the third wiring board 6C, a stepped portion is formed in a portion where the recess 83 is formed. In the stepped portion, a first edge 88 and a second edge 89 are formed to be adjacent to each other.

The wiring boards 6A, 6B, and 6C are stacked such that the first edges 84, 86, and 88 and the second edges 85, 87, and 89 alternately overlap each other. For example, the first edge 84 of the first wiring board 6A, the second edge 87 of the second wiring board 6B, and the first edge 88 of the third wiring board 6C overlap each other in the thickness direction. In addition, the second edge 85 of the first wiring board 6A, the first edge 86 of the second wiring board 6B, and the second edge 89 of the third wiring board 60 overlap each other in the thickness direction.

The holding claw 52 of the conveyance mechanism 50 holds the second edges 85, 87, and 89. At this time, there is a gap below the second edges 87 and 89. For example, the recess 82 is positioned between the second edge 89 of the third wiring board 6C and the second edge 85 of the first wiring board 6A. Thus, the conveyance mechanism 50 can easily insert the holding claw 52 into a lower side of the second edge 89 without causing the holding claw 52 to interfere with the second wiring board 6B.

Incidentally, the stepped portions formed by the first edges 84, 86, and 88 and the second edges 85, 87, and 89 as described above are also present in the wiring boards 6A, 6B, and 6C (for example, see FIG. 13) of the above embodiment. For example, a distal end surface of the fourth protrusion 63d corresponds to the second edge in a portion where the fourth protrusion 63d of the third wiring board 6C is formed. In addition, a portion adjacent to the fourth protrusion 63d in the second side 6f corresponds to the first edge. Similarly, the stepped portion in which the first edge and the second edge are adjacent to each other is formed even in the fourth protrusion 62d of the second wiring board 6B and the fourth protrusion 61d of the first wiring board 6A. The wiring boards 6A, 6B, and 6C are stacked such that the first edges and the second edges alternately overlap each other.

Second Modification of Embodiment

A second modification of the embodiment will be described. The shapes of the wiring boards 6A, 6B, and 6C are not limited to rectangles. The number of protrusions arranged on one wiring board is not limited to six. For example, the number of protrusions arranged on the wiring boards 6A, 6B, and 6C may be five or less or may be seven or more. Incidentally, the number of protrusions arranged on one wiring board is desirably common to the respective wiring boards 6A, 6B, and 6C. The number of wiring boards is not limited to three. For example, the number of wiring boards may be one or may be four or more.

The shapes and arrangements of the protrusions 73 are not limited to the illustrated shapes and arrangements. For example, the shape of the protrusion 73 may be a shape in which a distal end is curved in an arc shape, an arc shape, or the like, instead of the rectangle. The position of the protrusion 73 is not limited to the base 74 of the terminal portion 72. The position of the protrusion 73 on the side surface of the terminal portion 72 is appropriately set.

The content disclosed in the above-described embodiment and modification can be executed in an appropriately combined manner.

An electrical connection box according to the present embodiment includes: a frame main body; a lid assembled to the frame main body; a plate-shaped member sandwiched between the frame main body and the lid; and a bus bar which has a main body arranged on a surface of the plate-shaped member and a terminal portion bent from the main body toward the lid. The bus bar has a protrusion protruding from a side surface of the terminal portion, the lid has a bus bar holding portion into which the terminal portion is inserted, and a wall portion opposing the side surface of the terminal portion has a holding groove in which the protrusion is press-fitted into the bus bar holding portion.

According to the electrical connection box of the present embodiment, the lid can be assembled to the frame main body in a state where the bus bar is held by the lid. For example, an effect that it is possible to improve the workability of assembling work by causing the lid to hold the bus bar which is unstable merely by being mounted on the frame main body.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
   a frame main body;
   a lid assembled to the frame main body;
   a plate-shaped member sandwiched between the frame main body and the lid; and
   a bus bar that has a main body arranged on a surface of the plate-shaped member and a terminal bent from the main body toward the lid, wherein
   the whole terminal is bent from the main body in a direction orthogonal to the main body,
   the bus bar further has a protrusion protruding laterally from a side surface of the terminal,
   the lid has a bus bar holding portion into which the terminal is inserted, and
   in the bus bar holding portion, a wall portion opposing the side surface of the terminal has a holding groove into which the protrusion is press-fitted.

2. The electrical connection box according to claim 1, wherein
   all terminals bent with respect to the main body are bent toward a side of the lid in a plurality of the bus bars having the protrusions.

3. The electrical connection box according to claim 2, wherein
   a plurality of the plate-shaped members are arranged to be stacked between the frame main body and the lid,
   a stepped portion is formed on a side of the plate-shaped member such that a first edge and a second edge protruding toward a direction orthogonal to the side with respect to the first edge are adjacent to each other, and
   the plurality of plate-shaped members are stacked such that the first edge and the second edge are alternately overlapped.

4. The electrical connection box according to claim 2, wherein
   the protrusion is arranged at a base end of the terminal.

5. The electrical connection box according to claim 2, wherein
   the wall portion opposing the side surface of the terminal further has a guide groove to guide the terminal in the bus bar holding portion, and
   a center line of the holding groove and a center line of the guide groove overlap each other when the wall portion opposing the side surface of the terminal is viewed from a front side.

6. The electrical connection box according to claim 1, wherein
   a plurality of the plate-shaped members are arranged to be stacked between the frame main body and the lid,
   a stepped portion is formed on a side of the plate-shaped member such that a first edge and a second edge protruding toward a direction orthogonal to the side with respect to the first edge are adjacent to each other, and
   the plurality of plate-shaped members are stacked such that the first edge and the second edge are alternately overlapped.

7. The electrical connection box according to claim 6, wherein
   the protrusion is arranged at a base end of the terminal.

8. The electrical connection box according to claim 6, wherein
   the wall portion opposing the side surface of the terminal further has a guide groove to guide the terminal in the bus bar holding portion, and
   a center line of the holding groove and a center line of the guide groove overlap each other when the wall portion opposing the side surface of the terminal is viewed from a front side.

9. The electrical connection box according to claim 1, wherein
   the protrusion is arranged at a base end of the terminal.

10. The electrical connection box according to claim 9, wherein
    the wall portion opposing the side surface of the terminal further has a guide groove to guide the terminal in the bus bar holding portion, and
    a center line of the holding groove and a center line of the guide groove overlap each other when the wall portion opposing the side surface of the terminal is viewed from a front side.

11. The electrical connection box according to claim 1, wherein
    the wall portion opposing the side surface of the terminal further has a guide groove to guide the terminal in the bus bar holding portion, and
    a center line of the holding groove and a center line of the guide groove overlap each other when the wall portion opposing the side surface of the terminal is viewed from a front side.

* * * * *